(12) United States Patent
Schuisky (10) Patent No.: US 7,875,360 B2
(45) Date of Patent: Jan. 25, 2011

(54) STEEL STRIP COATED WITH ZIRCONIA

(75) Inventor: Mikael Schuisky, Sandviken (SE)

(73) Assignee: Sandvik Intellectual Property AB, Sandviken (SE)

( * ) Notice: Subject to any disclaimer, the term of this patent is extended or adjusted under 35 U.S.C. 154(b) by 777 days.

(21) Appl. No.: 10/577,549

(22) PCT Filed: Dec. 3, 2004

(86) PCT No.: PCT/SE2004/001810

§ 371 (c)(1),
(2), (4) Date: Mar. 12, 2007

(87) PCT Pub. No.: WO2005/054538

PCT Pub. Date: Jun. 16, 2005

(65) Prior Publication Data

US 2007/0218310 A1 Sep. 20, 2007

(30) Foreign Application Priority Data

Dec. 5, 2003 (SE) .................................. 0303281

(51) Int. Cl.
*B05D 1/06* (2006.01)
(52) U.S. Cl. ...................... 428/469; 428/472
(58) Field of Classification Search ........... 428/469, 428/472
See application file for complete search history.

(56) References Cited

U.S. PATENT DOCUMENTS

| | | | |
|---|---|---|---|
| 3,920,583 A | 11/1975 | Pugh | |
| 4,519,339 A | 5/1985 | Izu et al. | |
| 4,585,537 A | 4/1986 | Nakayama et al. | |
| 5,510,008 A | 4/1996 | Sekhar et al. | |
| 7,147,932 B2 | 12/2006 | Hultin Stigenberg et al. | |
| 2004/0060967 A1* | 4/2004 | Yang et al. | 228/122.1 |
| 2004/0229031 A1* | 11/2004 | Gell et al. | 428/323 |
| 2005/0064214 A1 | 3/2005 | Hultin Stigenberg et al. | |
| 2005/0064215 A1 | 3/2005 | Hultin Stigenberg et al. | |
| 2006/0093860 A1 | 5/2006 | Schuisky et al. | |
| 2006/0204672 A1 | 9/2006 | Schuisky et al. | |

(Continued)

FOREIGN PATENT DOCUMENTS

EP  0 353 060 B1  1/1990

(Continued)

OTHER PUBLICATIONS

T. Satoh et al., "Cu(In,Ga)Se2 solar cells on stainless steel substrates covered with insulating layers", Solar Energy Materials & Solar Cells 75, pp. 65-71 (2003).

(Continued)

*Primary Examiner*—Gwendolyn Blackwell
(74) *Attorney, Agent, or Firm*—Drinker Biddle & Reath LLP (57) ABSTRACT

A flexible metallic strip product including a ferritic chromium strip steel material having a coating of an electrically insulating layer of zirconia stabilized with yttrium, said coating being intended to receive a second coating of an electrically conducting layers is disclosed. This coating is very efficient as an electrically insulating layer in flexible solar cells and solid state thin film batteries because it has practically the same thermal expansion coefficient as the steel substrate.

25 Claims, 5 Drawing Sheets

U.S. PATENT DOCUMENTS

| | | | |
|---|---|---|---|
| 2007/0042204 A1 | 2/2007 | Hultin Stigenberg et al. |
| 2007/0042205 A1 | 2/2007 | Hultin Stigenberg et al. |
| 2007/0072008 A1 | 3/2007 | Hultin Stigenberg et al. |
| 2007/0082214 A1 | 4/2007 | Hultin Stigenberg et al. |
| 2007/0218310 A1 | 9/2007 | Schuisky |
| 2007/0224350 A1 | 9/2007 | Schuisky |
| 2007/0275264 A1 | 11/2007 | Hultin et al. |

FOREIGN PATENT DOCUMENTS

| | | |
|---|---|---|
| EP | 0 416 887 A2 | 3/1991 |
| EP | 0 416 887 B1 | 3/1991 |
| EP | 1 033 416 A1 | 9/2000 |
| JP | 56-111804 | 9/1981 |
| JP | 60-149778 | 8/1985 |
| JP | 4-193968 | 7/1992 |
| JP | 6-315641 | 11/1994 |
| JP | 10-330930 | 12/1998 |
| JP | 2002-038266 | 2/2002 |
| WO | WO 98/08986 | 3/1998 |
| WO | WO 03/007386 | 1/2003 |
| WO | WO 03/048402 A1 | 6/2003 |
| WO | WO 2005/015645 | 2/2005 |

OTHER PUBLICATIONS

K. Herz et al., "Dielectric barriers for flexible CIGS solar modules", Thin Solid Films 403-404, pp. 384-389 (2003).

K. Hertz et al., "Diffusion barriers for CIGS solar cells on metallic substrates", Thin Solid Films 431-432, pp. 392-397 (2003).

S. Linderoth et al., "Invesstigations of Fe-Cr Ferritic Steels as SOFC Interconnect Material", Materials Research Society Symposium Processing, vol. 575, pp. 325-330 (2000).

* cited by examiner

STEEL STRIP COATED WITH ZIRCONIA

The present invention relates to a method of manufacturing a metal oxide coated metal strip product in a roll-to-roll process and in particular to a coated metallic substrate material suitable for manufacturing of thin film devices. This is achieved by producing a metallic strip with an electrically insulating oxide layer, in accordance with claim 1.

BACKGROUND

Several materials are used as substrate material and are under further development for the production of thin film flexible products. There exist several advantages to use flexible substrate materials, one being the possibility of roll-to-roll production processes, which lead to a more cost efficient production compared to batch type processes. Moreover, the thin film flexible products will have several technical advantages, for instance, they may be folded or rolled into compact packages and they may be used for making light weight products, which are required for portable, spatial and military applications. The common materials used for thin film flexible products include, e.g., plastic foils such as polyamide, metallic strips or foils such as stainless steel, titanium, copper, molybdenum, aluminum and nickel foils, bearing in mind that they all have to fulfil certain criteria. Thus, the substrate material should be thermally resistant in order to withstand further process steps in the production of thin film products, and this may include heat treatments at elevated temperatures under corrosive atmosphere. However, all the electrical conducting metallic strip materials used as substrate material for the production of thin film flexible products may need to be electrically insulated, if modules with integrated series connections are to be produced. Conventionally, the conducting metallic strip or foil material is coated with oxides such as aluminum oxide or silicon oxide, which are good electrical insulating oxides. However, these oxide layers usually have a large mismatch in the thermal expansion compared with the underlying metallic substrate. Thus, it is essential that the thermal expansion coefficient (TEC) of the substrate material should be as close as possible to the TEC of the electrically insulating metal oxide layer(s), in order to avoid thermal cracking or spallation of the insulating metal oxide layer.

The mismatch in thermal expansion (MTE) can be defined as follows: $(TEC_{ss}-TEC_{ox})/TEC_{ss}$ where the $TEC_{ss}$ is the thermal expansion of the metallic strip substrate and $TEC_{ox}$ is the thermal expansion of the metal oxide layer.

Ferritic stainless steels and yttrium-stabilized zirconia (abbreviated YSZ) are two materials commonly used in the fabrication of Solid Oxide Fuel Cells because these two materials have an extremely low mismatch in their thermal expansion. However, the YSZ in Solid Oxide Fuel Cells are not in the form of a thin coating but in the form of a thin plate, which is used as an electrolyte.

Common conventional solutions are:
 Depositing the electrically conducting back contact directly onto the metallic strip;
 Depositing insulating layers such as aluminum oxide, silicon oxide and silicon nitride onto metal strips, Both these solutions have their respective disadvantages. If the conducting back contact is directly deposited onto the flexible metal strip substrate, then it will limit the production of modules with integrated series connections. Furthermore, the material often used as insulating layers, such as $Al_2O_3$, $Si_4N_3$, $SiO_x$ or $SiO_2$, have a larger TEC mismatch with the underlying metallic strip, which may lead to the formation of cracks and pinholes due to heating during the following process steps. In table 1 the thermal expansion coefficients of some insulating materials and some steels have been summarized. Using the values of the thermal expansions given in Table 1, it is possible to calculate the thermal expansion mismatch (MTE) between the metallic strip substrate and the insulating coating. In Table 2 the MTE values between some of the steels and the listed insulating materials are given.

It is therefore a primary object of the present invention to provide a zirconium oxide coated metallic strip product, where the oxide layer and the metallic strip have a very low mismatch in thermal expansion, said product being suitable as a substrate material for the production of thin film flexible products, such as flexible $Cu(In; Ga)Se_2$ (abbreviated CIGS) solar cells and solid state thin film batteries.

Yet another object of the present invention is to provide a flexible substrate for thin film products that is inexpensive and which may be produced in a continuous roll-to-roll process.

These and other objects have been attained in a surprising manner by creating a coated metallic strip product with the features according to the characterizing clause of claim 1. Further preferred embodiments are defined in the dependent claims.

BRIEF DESCRIPTION

Thus, the above objects and further advantages are achieved by applying a thin continuous, uniform, electrically insulating layer of zirconia, the zirconia being stabilized with yttrium oxide or any other suitable metal oxide normally used for this purpose, on the top of a metal strip serving as substrate. The absolute composition of the zirconia layer can be tailor-made so that the thermal expansion matches the thermal expansion of the chosen metallic strip substrate. The zirconia layer should be smooth and dense in order to avoid any pinholes, which may otherwise function as pathways for electrical conduction when the material is further processed. In order to ensure safe electrical insulation from the metal strip substrate, multi-layers (ML) of zirconia can be deposited. The advantage of a ML structure is that it will terminate any pinholes or conducting pathways through the insulating oxide layers. Furthermore, by depositing a continuous uniform dense zirconia layer on top of the metallic substrate, it is easier to control the insulating properties as well as the thickness of the zirconia layer, compared to for instance anodized oxide layers on metallic strips. Moreover, the zirconia layer will also have an enhanced adhesion to the substrate, in comparison with thermally grown oxide layers. If needed, the zirconia layer may be deposited on both sides of the strip material, in order to totally eliminate any curling of the coated strip during heat treatments due to any small thermal expansion differences.

Further, if so required, on top of said zirconia layer may then be deposited a metal layer, this for obtaining a back electrical contact. If the final product is a CIGS flexible thin film solar cell, then this metal should be molybdenum. However, if the final product is a thin film battery, this metal back contact may be aluminum or copper.

DETAILED DESCRIPTION

The Metal Strip to be Coated

The metal strip to be coated can be any metallic strip material with a low thermal expansion mismatch with the zirconia coating, preferably a stainless steel and most preferably a ferritic chromium steel. Such steel substrate materials are produced by ordinary metallurgical steel making with a chromium content of at least 10% b.w. suitably more than 14% b.w., and most preferably in the range 16-25% b.w. Some examples of possible steel substrates are grade ASTM 430 with a chromium content of 16% b.w., and the Sandvik grade 0C404 with a chromium content of 20% b.w., and an aluminum content of 5.5% b.w. The ferritic strip is hot rolled down to an intermediate size, and thereafter cold-rolled in several steps with a number of recrystallization steps between said rolling steps, until a final thickness and a width of maximally 1000 mm are achieved. Another important parameter is the surface roughness of the metal strip, which should be as smooth as possible; a Ra value of less than 0.2 μm is suitable, preferably less than 0.1 μm. The surface of the substrate material is then cleaned in an appropriate way to remove all oil residuals from the rolling. The key issue for using a ferritic steel is that its thermal expansion coefficient (TEC) matches very well with the deposited zirconia coating, although other steel types fulfilling this criterion are also useful. Thus, it is desirable that the thermal expansion mismatch of the metallic strip substrate and the zirconia coating is lower than ±25% in the temperature range up to 1000° C. Furthermore, ferritic steels have also a very good corrosion resistance to withstand the environment in which the final thin film product will work. The physical shape of the metallic substrate is a strip or foil with a thickness in the range of 5 to 300 μm, preferably 10 to 100 μm.

The Insulating Zirconia Layer

The electrically insulating zirconia layers should adhere well to the metallic strip, in order to ensure highest possible flexibility of the thin film product without the zirconia layer flaking off or cracking. This is achieved by careful pre-treatment of the metal strip prior to the coating, first by cleaning it in a suitable way to remove all oil residues, etc., which may affect the efficiency of the coating process, and the adhesion and quality of the coating. Thereafter, the metal strip is treated by means of an in-line ion assisted etching process and, if necessary, a thin bond-coat layer may be deposited between the metal strip and the zirconia layer. Preferably, the bond-coat should consist essentially of a metal such as Ti, Zr, Ni or Cr, to enhance the adhesion of the zirconia layer to the substrate. Moreover, the zirconia layer should also be a good electrical insulator in order to avoid any electrical connection between the metallic strip and the molybdenum (or Al or Cu) back contact. This can be achieved by depositing a dense and smooth zirconia layer to bring about better insulating properties, it possibly being repeated so that multi-layered structures are deposited. The number of individual zirconia layers in a multi-layered structure can be 10 or less, preferably less than 5 and at best only two layers. As mentioned above, a multi-layered zirconia structure will terminate any pinholes or electrical pathways through the overall metal oxide layer and ensure good electrical insulation of the metallic strip. The thickness of each individual zirconia layer may be between 10 nm and 2 μm, preferably between 0.1 and 1.5 μm. The total thickness of the overall zirconia layer may be up to 20 μm, preferably 0.5 to 5 μm.

The preferred chemical composition of the zirconia layer is $ZrO_2$ stabilized with $Y_2O_3$, the percentage of $Y_2O_3$ in the zirconia can be from 0-25% b.w., preferably 3-20% b.w., or most preferably 5-15% b.w., although other stabilizing metal oxides are feasible (both stoichiometric and non-stoichiometric). The zirconia could also possibly be stabilized by for example Al-oxide.

Description of Back Contact Layer

When required, a top conducting metallic layer can be applied on top of the insulating zirconia layer. Depending on the final thin film product, different metals may be deposited, including aluminum, molybdenum, nickel, cobalt, copper, silver, gold and platinum. This metallic top layer should be dense and adhere well to the underlying, previously deposited oxide layer. The thickness of this metallic layer should be 0.01-5.0 μm.

Description of Coating Method

A broad variety of coating techniques may be used as long as they provide a continuous uniform and adherent layer. These may be techniques such as spraying, High Velocity Oxygen Fuel (HVOF), dipping, Physical Vapor Deposition (PVD), Chemical Vapor Deposition (CVD) or any other known technique for applying a fluid gel or powder of a Zr-containing compound on the surface of the ferritic steel, preferably by PVD in a roll-to-roll Electron Beam Evaporation (EB) process as disclosed in WO 98/08986. If necessary, the PVD process can also be plasma-activated to achieve even better insulating oxide layers. It is also possible to apply the coating in the form of a fine grain powder. The conditions for applying and forming the zirconia layer on the surface may have to be determined experimentally for each individual case. The coating will be affected by factors such as temperature, time drying, time heating, composition and properties, as well as by the ferritic steel and the Zr-containing compound.

Advantageously, the coating method is integrated in a conventional roll-to-roll strip production line.

Advantageous Embodiment

Firstly, the substrate materials are produced by ordinary metallurgical steel-making to a chemical composition as described above. Subsequently, they are hot-rolled down to an intermediate size, and thereafter cold-rolled in several steps with a number of recrystallization steps between said rolling steps, until a final thickness of 0.005-0.3 mm and a width of up to 1000 mm are achieved. The surface of the substrate material is then cleaned in a proper way to remove all oil residuals from the rolling.

Figure 1:
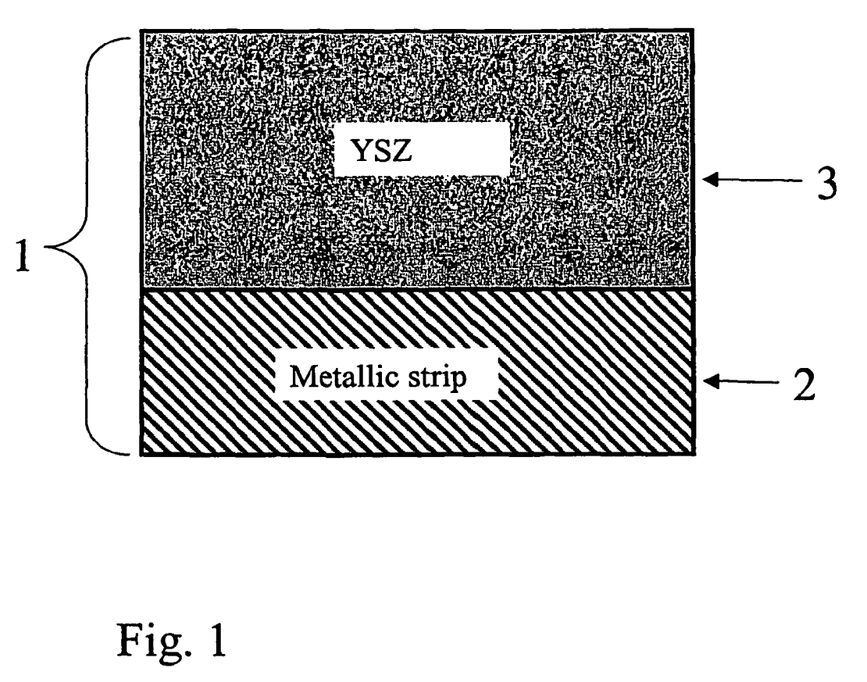
FIG. 1 shows a schematic cross-section of a first embodiment of the present invention.

In FIG. 1, a typical cross section of a zirconia coated flexible ferritic steel 1 is shown, one side of which has been coated with a YSZ layer 3 for the production of thin film products. The substrate material 2 is a flexible ferritic steel strip, which has a thermal expansion mismatch lower than ±25% with the zirconia coating in the temperature range 0-1000° C. The surface roughness of the ferritic steel strip should be kept as low as possible. The thickness of the ferritic steel should be in the range of 5-300 μm, preferably 10-100 μm, to ensure good flexibility.

On top of the surface of the ferritic steel strip 2 is situated an electrically insulating yttrium stabilized zirconia layer 3 deposited in a roll-to-roll process. The yttrium stabilized zirconia layer should be well adherent to the metal strip, as well as dense and smooth. Well adherent is in this context considered to mean that the coated metal strip is able to be bent 90° over a radius equal to the thickness of the strip without the coating showing any tendency of flaking, spalling or the like.

Figure 2:
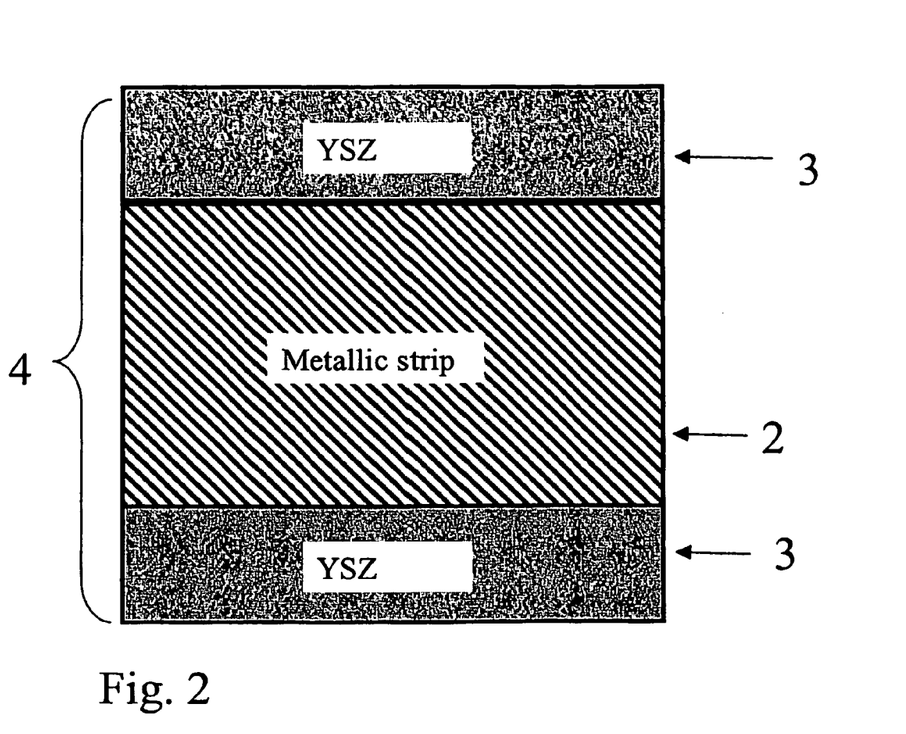
FIG. 2 shows a schematic cross-section of a second embodiment of the present invention.

In a variation of the above described flexible metallic substrate being coated on one side only with YSZ, also the other side of the metallic strip may be coated with YSZ, to produce a product 4, which is illustrated in FIG. 2. In the FIG. 2, the substrate material 2 has been coated on both sides with YSZ 3 and the two YSZ layers 3 should have the same thickness to achieve a total elimination of any thermal deformation of the coated strip due to the YSZ coatings in further process steps.

Figure 3:
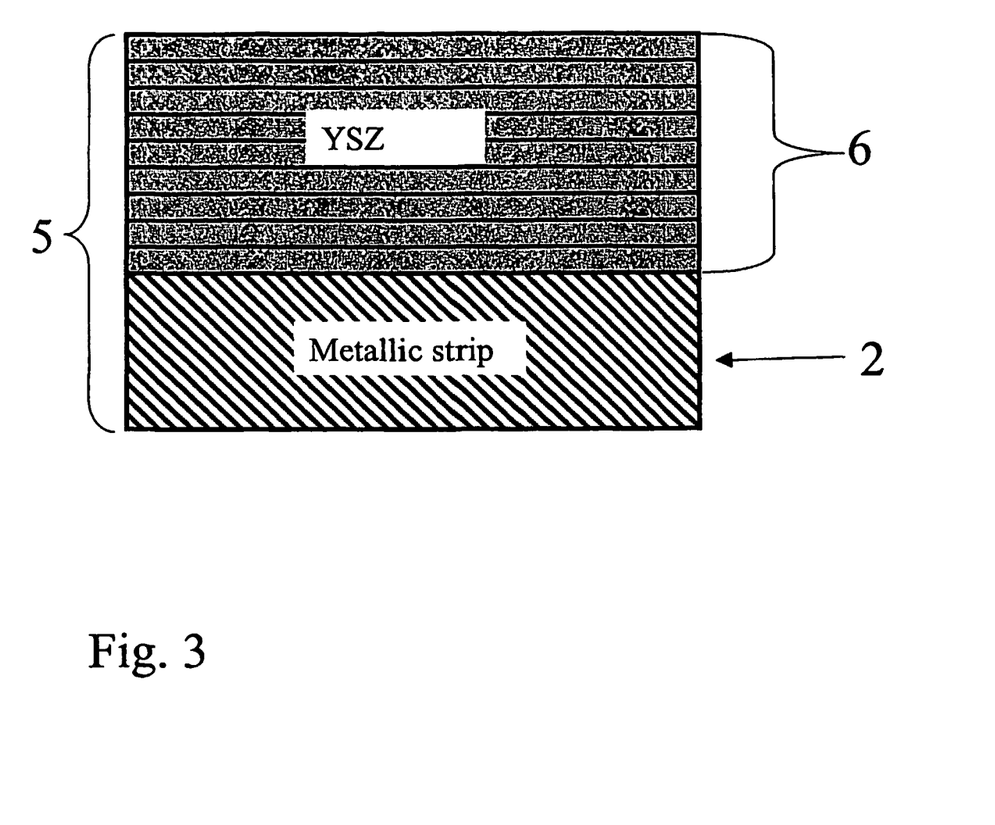
FIG. 3 shows a schematic cross-section of a third embodiment of the present invention.

According to a further variation of the invention, the strip product 5 consists of a flexible metallic strip 2 coated with a multi-layer structure 6 of YSZ, as illustrated in FIG. 3. The number of individual zirconia layers in the multi-layered structure 6 can be 10 or less, preferably less than 5 and at best only two layers. As mentioned before, a multi-layered zirconia structure will terminate any pinholes or electrical pathways through the overall metal oxide layer and ensure good electrical insulation of the metallic strip. The thickness of each individual zirconia layer may be between 10 nm and up to 2 μm, preferably between 0.1 and 1.5 μm. The total thickness of the overall zirconium oxide layer may be up to 20 μm, preferably 1 to 5 μm.

Figure 4:
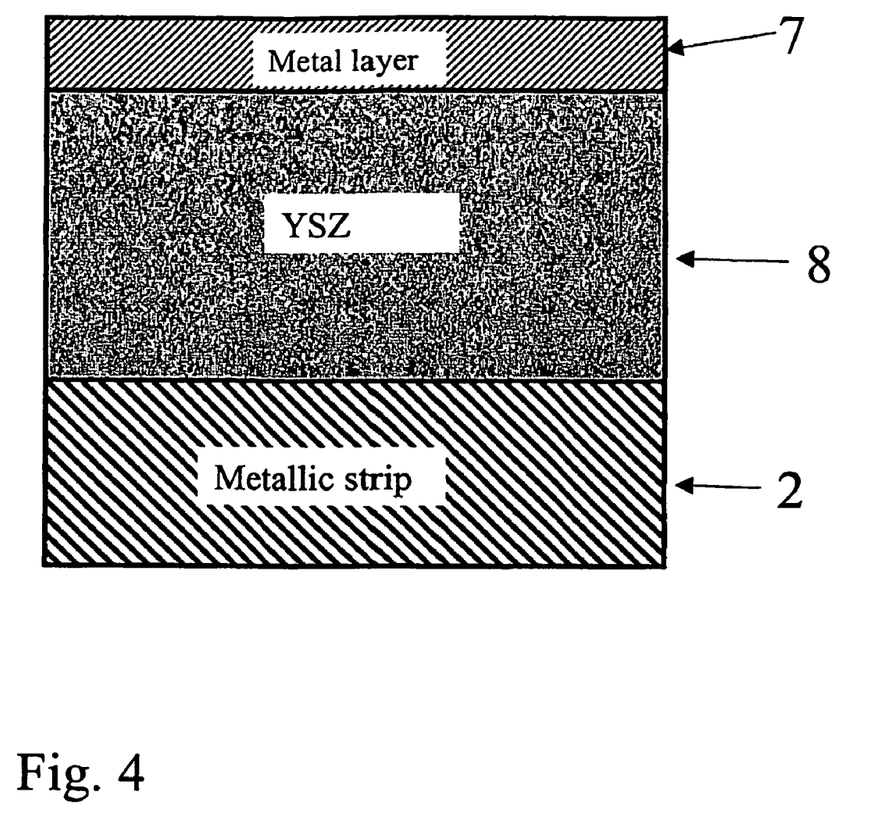
FIG. 4 shows a schematic cross-section of fourth embodiment of the present invention.

In order to create a conducting back contact for the production of thin film products, a metal layer 7 can be deposited on top of the electrically insulated, YSZ-coated (8) ferritic steel strip 2, as illustrated in FIG. 4. Depending on the final thin film product, the metal layer 7 can consist of different metals, including aluminum, molybdenum, nickel, cobalt, copper, silver, gold and platinum; the preferred metal being aluminum, molybdenum, silver and/or copper, or alloys consisting mainly of molybdenum. The metal layer 7 should be dense and well adherent to the zirconia coating to avoid cracking or spallation. Furthermore, the metal layer 7 should have a thickness of between 0.1-5 μm, preferably 0.2-2 μm, and most preferably around 0.5 μm.

Figure 5:
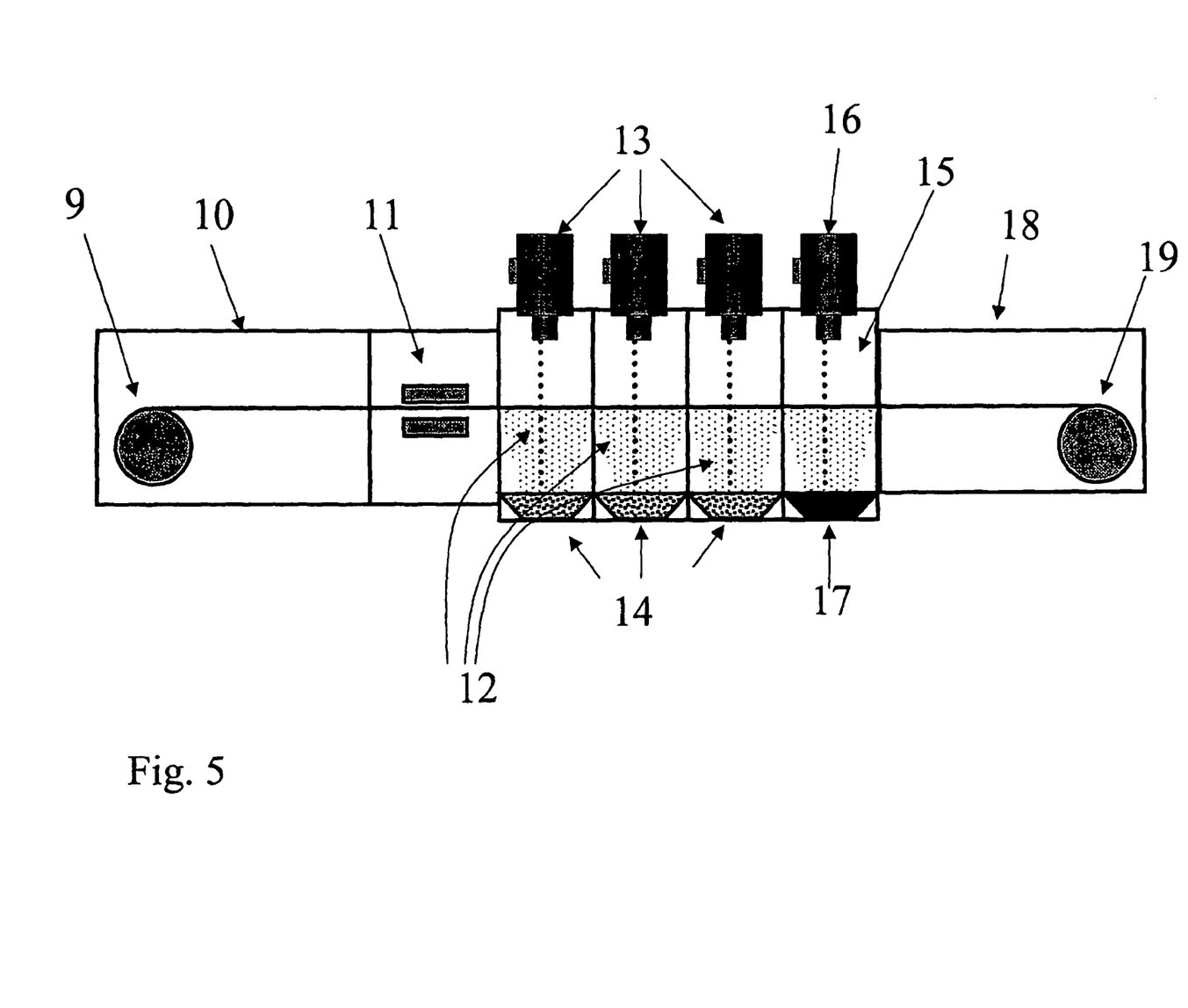
FIG. 5 shows schematically a production line for the manufacturing of a coated metal strip material according to the invention.

The roll-to-roll electron beam evaporation process is illustrated in FIG. 5. The first part of such a production line is the uncoiler 9 within a vacuum chamber 10, then the in-line ion assisted etching chamber 11, followed by a series of EB evaporation chambers 12, the number of EB evaporation chambers needed can vary from 1 up to 10 chambers, this to achieve the wanted multi-layered metal oxide structure. All the metal oxide EB evaporation chambers 12 are equipped with EB guns 13 and crucibles 14 for the evaporation. The following chamber is a separate chamber 15 for the EB evaporation of a metal top layer, this chamber is also equipped with an EB gun 16 and a crucible 17 for the metal melt. The need for a separate EB evaporation chamber for the metal top layer can be excluded if only metal oxide coated strips are to be produced. After this chamber comes the exit vacuum chamber 18 and the recoiler 19 for the coated strip material, the recoiler being located within vacuum chamber 18. The vacuum chambers 10 and 18 may also be replaced by an entrance vacuum lock system and an exit vacuum lock system, respectively. In the latter case, the uncoiler 9 and the coiler 19 are placed in the open air.

TABLE 1

| Material | Temperature Range | Thermal Expansion |
|---|---|---|
| $Si_3N_4(\alpha)$ | 25-1000 K | $2.9 \times 10^{-6} K^{-1}$ |
| $Si_3N_4(\beta)$ | 25-1000 K | $2.25 \times 10^{-6} K^{-1}$ |
| $Al_2O_3$ (polycryst.) | 0-1027° C. | $8.12 \times 10^{-6} K^{-1}$ |

TABLE 1-continued

| Material | Temperature Range | Thermal Expansion |
|---|---|---|
| $TiO_2$ (polycryst.) | 25-1000° C. | $8.83 \times 10^{-6} K^{-1}$ |
| $SiO_2$ (vitreous) | 25-1000° C. | $0.564 \times 10^{-6} K^{-1}$ |
| YSZ | 25-1000° C. | $11 \times 10^{-6} K^{-1}$ |
| $Fe_{80}Cr_{20}$ | 25-1000° C. | $13.5 \times 10^{-6} K^{-1}$ |
| $Fe_{70}Cr_{30}$ | 25-1000° C. | $13.0 \times 10^{-6} K^{-1}$ |
| Sandvik grade 0C44 | 30-900° C. | $11.10 \times 10^{-6} K^{-1}$ |
| ASTM 430 | 30-900° C. | $12.05 \times 10^{-6} K^{-1}$ |
| St1.4016 | 25-1000° C. | $13.2 \times 10^{-6} K^{-1}$ |
| St1.4742 | 25-1000° C. | $14.3 \times 10^{-6} K^{-1}$ |
| St1.4749 | 25-1000° C. | $13.7 \times 10^{-6} K^{-1}$ |

TABLE 2

| Steel | Insulating layer | Calculated MTE (%) |
|---|---|---|
| St1.4016 | $SiO_2$ | 95.7% |
| St1.4016 | $Si_3N_4(\alpha)$ | 78% |
| St1.4016 | $Al_2O_3$ | 38% |
| St1.4016 | $TiO_2$ | 33% |
| St1.4016 | YSZ | 16.7% |
| $Fe_{80}Cr_{20}$ | $SiO_2$ | 96% |
| $Fe_{80}Cr_{20}$ | $Si_3N_4(\alpha)$ | 78.5% |
| $Fe_{80}Cr_{20}$ | $Al_2O_3$ | 40% |
| $Fe_{80}Cr_{20}$ | $TiO_2$ | 35% |
| $Fe_{80}Cr_{20}$ | YSZ | 19% |
| 0C44 | $SiO_2$ | 95% |
| 0C44 | $Si_3N_4(\alpha)$ | 74% |
| 0C44 | $Al_2O_3$ | 27% |
| 0C44 | $TiO_2$ | 20% |
| 0C44 | YSZ | 1% |
| St1.4742 | $SiO_2$ | 80% |
| St1.4742 | $Si_3N_4(\alpha)$ | 96% |
| St1.4742 | $Al_2O_3$ | 43% |
| St1.4742 | $TiO_2$ | 38% |
| St1.4742 | YSZ | 23% |

The invention claimed is:

1. Coated strip product comprising a ferritic chromium steel strip material and a coating, the coating comprising at least one electrically insulating layer of zirconia in direct contact with the steel strip material or in direct contact with an essentially metallic bond-coat which in turn is in direct contact with the steel strip material, wherein at least one additional layer of zirconia is deposited on top of the at least one layer of zirconia which is in direct contact with the steel strip material or in direct contact with a metallic bond-coat which in turn is in direct contact with the steel strip material, and wherein the steel strip material has a surface roughness of Ra<0.2 μm.

2. Coated strip product according to claim 1, wherein said coating and steel strip material have a thermal expansion mismatch of less than ±25% in the temperature range up to 1000° C., where the thermal expansion mismatch is defined as:

$$(TEC_{ss} - TEC_{ox})/TEC_{ss}$$

where $TEC_{ss}$ is the thermal expansion of said strip material and $TEC_{ox}$ is the thermal expansion of said zirconia coating.

3. Coated strip product according to claim 1, wherein the steel strip material has a surface roughness of Ra<0.1 μm.

4. Coated strip product according to claim 1, wherein the steel strip material has a thickness of 5 to 300 μm.

5. Coated strip product according to claim 1, wherein said ferritic chromium steel strip material has a chromium content of at least 10% by weight.

6. Coated strip product according to any of claim 1, wherein the steel strip material is coated with at least one zirconia layer on either side of the steel strip material.

7. Coated strip product according to any of claim 1, wherein the at least one layer of zirconia is stabilized zirconia.

8. Coated strip product according to claim 1, wherein a thickness of the at least one zirconia layer is between 0.1 and 20 μm.

9. Coated strip product according to claim 1, wherein between the zirconia layer and the steel strip material a metallic bond-coat is deposited to enhance the adhesion of the zirconia layer.

10. Coated strip product according to claim 1, wherein on top of the electrically insulating stabilized zirconia layer or layers a conducting metal layer is deposited, the metal layer selected from the group consisting of: aluminum, molybdenum, nickel, cobalt, copper, silver, gold and platinum.

11. Coated strip product according to claim 10, wherein the metal top layer has a thickness of between 0.01 and 5 μm.

12. Coated strip product according to claim 1 wherein the electrically insulating layer(s) is/are deposited by a spray technique, a vapor deposition technique, a dipping technique, or a sol-gel technique.

13. Substrate material for the production of a flexible thin film product wherein the substrate material consists essentially of a coated product according to claim 1.

14. Coated strip product according to claim 13, wherein the flexible thin film product is a $Cu(In,Ga)Se_2$ solar cell or a solid state thin film battery.

15. Coated strip product according to claim 4, where the thickness is 10 to 100 μm.

16. Coated strip product according to claim 5, wherein the chromium content is at least 14% by weight.

17. Coated strip product according to claim 16, wherein the chromium content is 16-25% by weight.

18. Coated strip product according to claim 7, wherein the stabilized Zirconia is yttrium stabilized zirconia with a percentage of $Y_2O_3$ in a range of 0-25% by weight of said layer.

19. Coated strip product according to claim 18, wherein the percentage of $Y_2O_3$ is in a range of 3-20% by weight of said layer.

20. Coated strip product according to claim 19, wherein the percentage of $Y_2O_3$ is 5-15% by weight of said layer.

21. Coated strip product according to claim 8, wherein the thickness is between 0.5 and 5 μm.

22. Coated strip product according to claim 9, wherein a metal of the metallic bond-coat is selected from the group consisting of Ti, Zr, Ni and Cr.

23. Coated strip product according to claim 12, wherein the spray technique is HVOF or plasma spraying.

24. Coated strip product according to claim 12, wherein the vapor deposition technique is chemical vapor deposition or physical vapor deposition.

25. Coated strip product according to claim 12, wherein the electrically insulating layer(s) is/are deposited by physical vapor deposition in a roll-to-roll electron beam evaporation process.

* * * * *